United States Patent
Ekambaram et al.

(10) Patent No.: US 10,484,041 B2
(45) Date of Patent: Nov. 19, 2019

(54) GLITCH-FREE WIDE SUPPLY RANGE TRANSCEIVER FOR INTEGRATED CIRCUITS

(71) Applicant: Xilinx, Inc., San Jose, CA (US)

(72) Inventors: Sabarathnam Ekambaram, Hyderabad (IN); VSS Prasad Babu Akurathi, Hyderabad (IN); Milind Goel, Hyderabad (IN); Hari Bilash Dubey, Hyderabad (IN)

(73) Assignee: XILINX, INC., San Jose, CA (US)

( * ) Notice: Subject to any disclaimer, the term of this patent is extended or adjusted under 35 U.S.C. 154(b) by 150 days.

(21) Appl. No.: 15/703,800

(22) Filed: Sep. 13, 2017

(65) Prior Publication Data

US 2019/0081656 A1    Mar. 14, 2019

(51) Int. Cl.
| | |
|---|---|
| *H04B 1/00* | (2006.01) |
| *H04B 1/58* | (2006.01) |
| *H04B 1/44* | (2006.01) |
| *H04B 1/04* | (2006.01) |
| *H03K 19/0185* | (2006.01) |

(52) U.S. Cl.
CPC ..... *H04B 1/586* (2013.01); *H03K 19/018521* (2013.01); *H04B 1/005* (2013.01); *H04B 1/0475* (2013.01); *H04B 1/44* (2013.01)

(58) Field of Classification Search
CPC ........ H04B 1/586; H04B 1/44; H04B 1/0475; H04B 1/005; H03K 19/018521
See application file for complete search history.

(56) References Cited

U.S. PATENT DOCUMENTS

| | | | |
|---|---|---|---|
| 9,735,763 B1 * | 8/2017 | Chen | H03K 5/08 |
| 2009/0080570 A1 * | 3/2009 | Bilash Dubey | G11C 5/147 375/319 |
| 2010/0030924 A1 * | 2/2010 | Shankar | G06F 13/385 710/14 |
| 2014/0111010 A1 | 4/2014 | Kumar et al. | |
| 2016/0094217 A1 * | 3/2016 | Garg | H03K 17/687 327/108 |

FOREIGN PATENT DOCUMENTS

WO    20120103106    8/2012

* cited by examiner

*Primary Examiner* — Syed Haider
(74) *Attorney, Agent, or Firm* — Robert M. Brush

(57) ABSTRACT

An example receiver includes: a pad splitter circuit coupled to a pad, the pad splitter circuit configured to generate a first logic signal and a second logic signal; a wide-range receiver coupled to the pad splitter circuit to receive the first and second logic signals, the wide-range receiver comprising a combination of a first Schmitt trigger receiver and a second Schmitt trigger receiver; a control circuit coupled to the pad splitter circuit and the wide-range receiver; and a bias generator circuit coupled to the pad splitter circuit and the wide-range receiver.

16 Claims, 11 Drawing Sheets

US 10,484,041 B2

GLITCH-FREE WIDE SUPPLY RANGE TRANSCEIVER FOR INTEGRATED CIRCUITS

TECHNICAL FIELD

Examples of the present disclosure generally relate to electronic circuits and, in particular, to a glitch-free wide supply range transceiver for integrated circuits.

BACKGROUND

Input/output (IO) circuits in an integrated circuit (IC) can support a variety of IO standards, requiring a wide supply range. Advancements in IC fabrication technologies have resulted in IO transistors that have lower voltage limits across any two terminals thereof. Thus, it is becoming increasingly challenging to design IO circuits that can accommodate multiple IO standards across a wide supply range. One technique to address this challenge is to divide the wide supply range into high voltage and low voltage ranges. Two different data paths can be used to drive the IO pad in the high- and low-voltage modes. Similarly, two different receivers can be used to receive data from the IO pad in the high- and low-voltage modes. However, such implementations can result in glitches at the IO pad and at the output of the receivers when there is switching from one mode to the other mode (high-to-low or low-to-high). Such glitches are due to mismatch in delay for turn-off and turn-on of the two data paths. Such glitches can cause undesirable state changes, resets, and functional failures.

SUMMARY

In an example, a transmitter includes: an input circuit configured to couple a logic signal to a first node and a second node; a first level-shifter having an input coupled to the first node; a first pre-driver having an input coupled to an output of the first level-shifter; a second-level shifter having an input coupled to the second node; a second pre-driver having an input coupled to an output of the second level-shifter, the second pre-driver configured to generate an output signal having a first voltage swing in a first mode and a second voltage swing in a second mode; and a driver including a stack of a top p-channel transistor, a bottom p-channel transistor, a top n-channel transistor, and a bottom n-channel transistor coupled between a supply node and a ground node, a gate of the top p-channel transistor coupled to receive the output signal of the second pre-driver, a gate of the bottom n-channel transistor coupled to an output of the first pre-driver, and gates of the bottom p-channel transistor and the top n-channel transistor coupled to receive first and second bias voltages, respectively.

In another example, a receiver includes: a pad splitter circuit coupled to a pad, the pad splitter circuit configured to generate a first logic signal and a second logic signal; a wide-range receiver coupled to the pad splitter circuit to receive the first and second logic signals, the wide-range receiver comprising a combination of a first Schmitt trigger receiver and a second Schmitt trigger receiver; a control circuit coupled to the pad splitter circuit and the wide-range receiver; and a bias generator circuit coupled to the pad splitter circuit and the wide-range receiver.

In another example, a transceiver includes a transmitter and a receiver. The transmitter includes: an input circuit configured to couple a logic signal to a first node and a second node; a first level-shifter having an input coupled to the first node; a first pre-driver having an input coupled to an output of the first level-shifter; a second-level shifter having an input coupled to the second node; a second pre-driver having an input coupled to an output of the second level-shifter, the second pre-driver configured to generate an output signal having a first voltage swing in a first mode and a second voltage swing in a second mode; and a driver including a stack of a top p-channel transistor, a bottom p-channel transistor, a top n-channel transistor, and a bottom n-channel transistor coupled between a supply node and a ground node, a gate of the top p-channel transistor coupled to receive the output signal of the second pre-driver, a gate of the bottom n-channel transistor coupled to an output of the first pre-driver, and gates of the bottom p-channel transistor and the top n-channel transistor coupled to receive first and second bias voltages, respectively. The receiver includes a pad splitter circuit coupled to an a pad, the pad splitter circuit configured to generate a first logic signal and a second logic signal; a wide-range receiver coupled to the pad splitter circuit to receive the first and second logic signals, the wide-range receiver comprising a combination of a first Schmitt trigger receiver and a second Schmitt trigger receiver; a control circuit coupled to the pad splitter circuit and the wide-range receiver; and a bias generator circuit coupled to the pad splitter circuit and the wide-range receiver.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
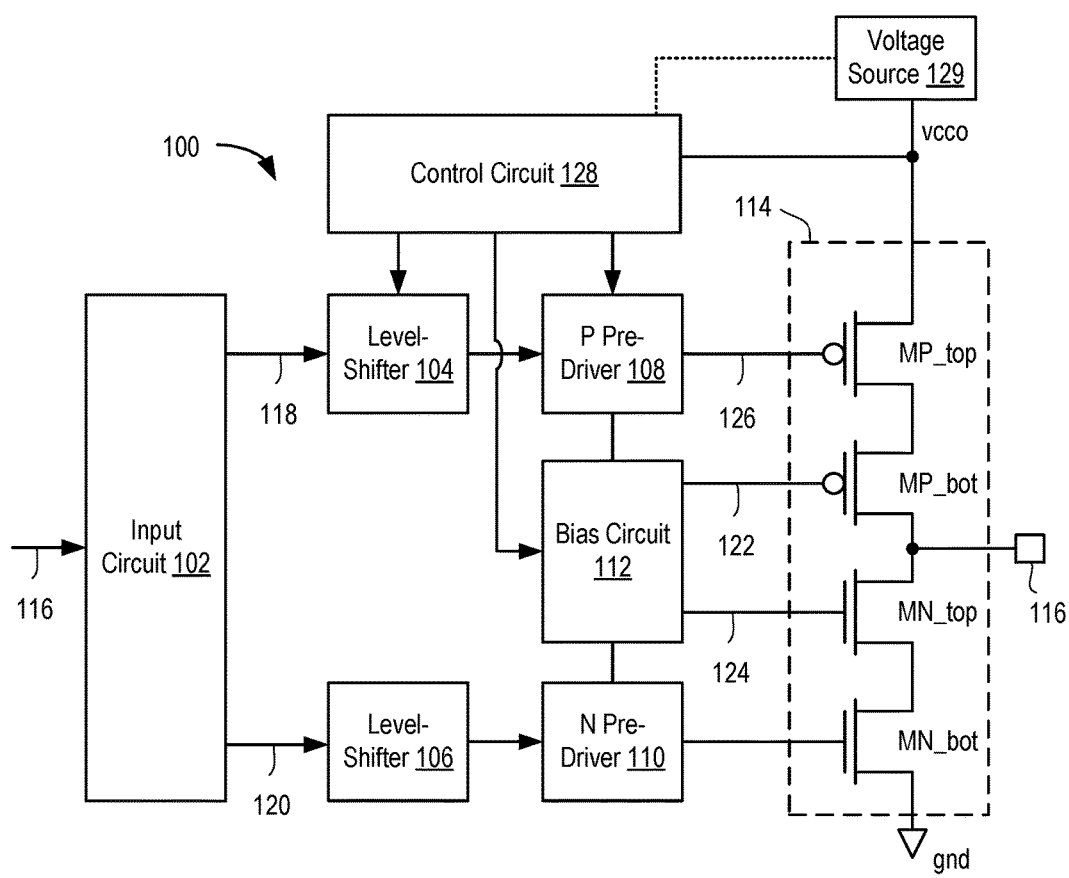
FIG. 1 is a block diagram of a transmitter according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

A glitch-free wide supply range transceiver for integrated circuits is described. In a transceiver that supports multiple supply voltages (e.g., 1.2, 1.5, 1.8, 2.5, 3.3 V), circuits are divided into two modes for reliability reasons (e.g., low-voltage (LV) mode for 1.2V, 1.5V and 1.8V and high-voltage mode (HV) mode for 2.5V and 3.3). The techniques described herein solve the problem of any glitch occurrence whenever there are mode changes by proving a single circuit solution during both operational modes. These and further aspects of the transceiver are described below with respect to the drawings.

FIG. 1 is a block diagram of a transmitter 100 according to an example. The transmitter 100 includes an input circuit 102, a level-shifter 104, a level-shifter 106, a P pre-driver 108, an N pre-driver 110, a bias circuit 112, a driver 114, and a control circuit 128. An input of the input circuit 102 is coupled to a node 116 for receiving an input logic signal. The input logic signal is a digital signal that has either a logic high or a logic low value. Outputs of the input circuit 102 are coupled to nodes 118 and 120, respectively. The input circuit 102 couples the input logic signal to the nodes 118 and 120.

An input of the level-shifter 104 is coupled to the node 118. An output of the level-shifter 104 is coupled to an input of the P pre-driver 108. An input of the level-shifter 106 is coupled to the node 120. An output of the level-shifter 106 is coupled to an input of the N pre-driver 110.

The driver 114 includes a stack of transistors MP_top, MP_bot, MN_top, and MN_bot coupled between a supply node vcco and a ground node gnd. In particular, the transistors MP_top and MP_bot are p-channel field effect transistors (FETs), such as p-type metal oxide semiconductor FETs (MOSFETs). The transistors MN_top and MN_bot are n-channel FETs, such as n-type MOSFETs. A source of the transistor MP_top is coupled to the supply node vcco. A drain of the transistor MP_top is coupled to a source of the transistor MP_bot. A drain of the transistor MP_bot is coupled to a drain of the transistor MN_top. A source of the transistor MN_top is coupled to a drain of the transistor MN_bot. A source of the transistor MN_bot is coupled to the node gnd. The drains of the transistors MP_bot and MN_top are coupled to an output node 116 (e.g., a pin or pad of an integrated circuit (IC) in which the transmitter 100 is disposed).

An output of the P pre-driver 108 is coupled to a gate of the transistor MP_top (referred to as a node 126). An output of the N pre-driver 110 is coupled to a gate of the transistor MN_bot. The bias circuit 112 includes outputs coupled to gates of the transistors MP_bot and MN_top. The bias circuit 112 supplies a bias voltage 122 to the transistor MP_bot and a bias voltage 124 to the transistor MN_top.

The control circuit 128 includes an output coupled to an input of the level-shifter 104, an output coupled to an input of the P pre-driver 108, and an output coupled to an input of the bias circuit 112. In operation, the control circuit 128 controls the level-shifter 104, the P pre-driver 108, and the bias circuit 112 based on a mode of the transmitter 100. The selected mode depends on the voltage level of the node vcco (i.e., the level of the vcco voltage supplied by an external circuit (not shown)). In an example, the transmitter 100 is in LV mode until vcco crosses a threshold voltage (e.g., 2.1 V), after which the transmitter 100 is in HV mode. For example, vcco can be selectable among a plurality of voltages, such as 1.2 V, 1.35, 1.5 V, 1.8 V, 2.5 V, and 3.3 V. The voltages 1.2 V, 1.35 V, 1.5 V, and 1.8 V correspond to the LV mode, and the voltages 2.5 V and 3.3 V correspond to the HV mode. The control circuit 128 can monitor the node vcco to determine whether the transmitter 100 is in HV mode or LV mode. Alternatively, the control circuit 128 can be configurable to select a mode. In such case, the control circuit 128 can control a voltage source 129 that provides vcco.

Table 1 below summarizes IO signaling in the transmitter 100 in the HV and LV modes.

TABLE 1

| HV Mode | LV Mode |
| --- | --- |
| MP_top (Signal) vcco − 1.8 -> vcco | MP_top (Signal) 0 -> vcco |
| MP_bot (ON) Bias = vcco − 1.8 | MP_bot (ON) Bias = gnd |
| MN_top (ON) Bias = vccaux | MN_top (ON) Bias = vccaux |
| MN_bot (Signal) 0 -> vccaux | MN_bot (Signal) 0 -> vccaux |

In Table 1, the bias voltage 124 is vccaux (e.g., an auxiliary voltage to protect devices, such as 1.8 V). In both HV and LV modes, the transistor MN_top is biased on by the gate voltage vccaux. In both HV and LV modes, the gate voltage of MN_bot (Signal) swings between 0 and vccaux. In the HV mode, the transistor MP_bot is biased on by a gate voltage of (vcco-1.8), and the gate voltage of the transistor MP_top (Signal) swings between (vcco-1.8) and vcco. In LV mode, the transistor MP_bot is biased on by a gate voltage of gnd, and the gate voltage of the transistor MP_top (Signal) swings between 0 and vcco. The voltage 1.8 is selected so that the transistor MP_top is not damaged by a voltage greater than 1.8 between any two terminals. The voltage 1.8 in Table 1 can be different depending on the characteristics of the transistor MP_top.

Table 2 below summarizes IO high-impedance in the transmitter 100 in the HV and LV modes.

TABLE 2

| HV Mode | LV Mode |
| --- | --- |
| MP_top (OFF) gate = vcco | MP_top (OFF) gate = vcco |
| MP_bot (ON) Bias = vcco − 1.8 | MP_bot (ON) Bias = gnd |
| MN_top (ON) Bias = vccaux | MN_top (ON) Bias = vccaux |
| MN_bot (OFF) gate = 0 | MN_bot (OFF) gate = 0 |

In Table 2, the transistors MP_top and MN_bot are controlled to be cut-off in both HV and LV modes. The gate voltage of MP_top is vcco and the gate voltage of MN_bot is 0 in both modes. The transistor MN_top is biased on with a gate voltage vccaux in both modes. The transistor MP_bot is biased on with a gate voltage vcco-1.8 in the HV mode, and a gate voltage of gnd in the LV mode.

In the transmitter 100, there is a single path from the input circuit 102 to the transistor MP_top of the driver 114 (as opposed to an HV path and an LV path). The output swing of the P pre-driver 108 is controllable between the LV and HV modes (e.g., by the control circuit 128). For example, as described in the example Table 1 above, the output swing of the P pre-driver 108 can be from 0 to vcco in the LV mode. In the HV mode, the output swing of the P pre-driver 108 can be from (vcco-1.8) to vcco. Thus, whenever a mode transition occurs (HV to LV or LV to HV), only the signal swing of the P pre-driver 108 changes and no glitches appear at the output node 116. Further, in the high-impedance mode, the gate of MP_top is at vcco and MP_bot is biased on regardless of the mode of operation. This ensures smooth operation without any glitches at the output node 116.

In the example of Table 1, the output swing of the N pre-driver 110 is 0 to vccaux in both LV and HV modes. The N pre-driver 110 can be an inverter. The level-shifter 106 is configured to level-shift the logic signal to swing between 0 and vccaux. The P pre-driver 108 also functions as an inverter. An example circuit implementation of the P pre-driver 108 is shown in FIG. 2 and described below.

Figure 2:
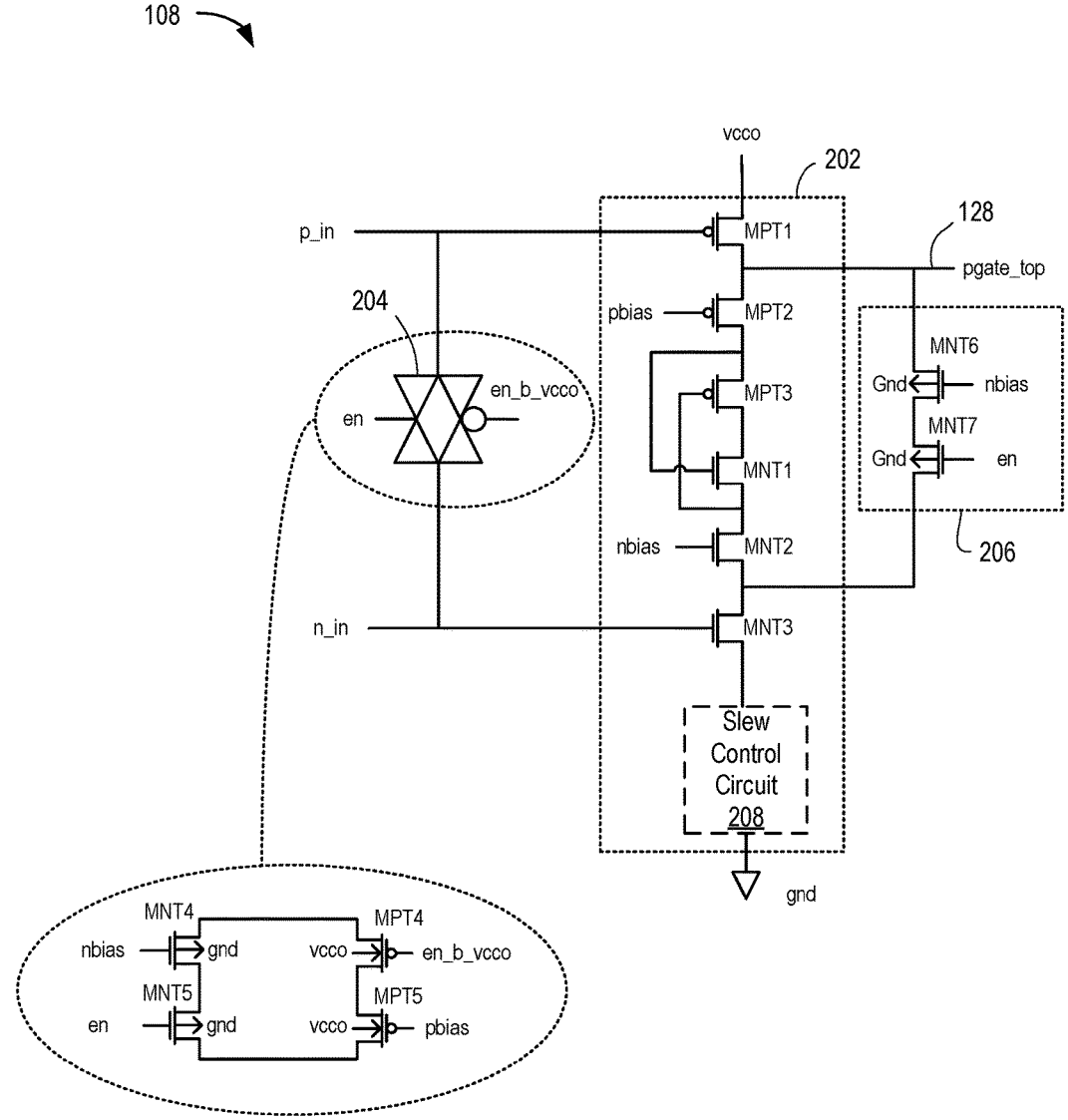
FIG. 2 is a schematic diagram depicting a pre-driver according to an example.

FIG. 2 is a schematic diagram depicting the P pre-driver 108 according to an example. The P pre-driver 108 includes a transistor stack 202, a transmission gate 204, and a transmission gate 206. The transistor stack 202 includes p-channel transistors MPT1, MPT2, and MPT3, as well as n-channel transistors MNT1, MNT2, and MNT3. A source of the transistor MPT1 is coupled to the supply node vcco. A drain of the transistor MPT1 is coupled to a source of the transistor MPT2. A drain of the transistor MPT2 is coupled to a source of the transistor MPT3. A drain of the transistor MPT3 is coupled to a drain of the transistor MNT1. A source of the transistor MNT1 is coupled to a drain of the transistor MNT2. A source of the transistor MNT2 is coupled to a drain of the transistor MNT3. A source of the transistor MNT3 is coupled directly to the ground node (gnd) or a reference node that is indirectly coupled to the ground node through an optional slew control circuit 208.

A gate of the transistor MPT1 is coupled to a node p_in. A gate of the transistor MNT3 is coupled to a node n_in. The nodes p_in and n_in are coupled to the output of the level-shifter 104. A gate of the transistor MPT2 is coupled to receive a bias voltage pbias. A gate of the transistor MNT2 is coupled to receive a bias voltage nbias. The bias voltages pbias and nbias are generated by the bias circuit 112. A gate of the transistor MPT3 is coupled to the source of the transistor MNT1. A gate of the transistor MNT1 is coupled to a source of the transistor MPT3. A node pgate_top is formed by the drain of the transistor MPT1 and the source of the transistor MPT2. The node pgate_top is coupled to the node 126 (i.e., the gate of the transistor MP_top in the driver 114). Transistors MPT2 and MNT2 protect the transistors MPT1 and MNT3, respectively, from high-voltage stress. The transistors MPT3 and MNT1 mitigate hot-carrier injection (HCI) degradation due to transistor switching. The slew control circuit 208 can be provided to control the slew of the inverter formed by the transistor stack 202.

The transmission gate 204 is coupled between the nodes p_in and n_in. The transmission gate 204 includes n-channel transistors MNT4 and MNT5 and p-channel transistors MPT4 and MPT5. Substrate terminals of the transistors MNT4 and MNT5 are coupled to the ground node gnd. Substrate terminals of the transistors MPT4 and MPT5 are coupled to the supply node vcco. For clarity, the substrate terminals of the other transistors (i.e., those not part of the transmission gates) are omitted from the drawing. It is to be understood that the substrate terminals of n-channel transistors can be connected to the ground node and substrate terminals of the p-channel transistors can be coupled to the supply node. One source/drain of the transistor MNT4 is coupled to the node p_in, and the other source/drain of the transistor MNT4 is coupled to a source/drain of the transistor MNT5. The other source/drain of the transistor MNT5 is coupled to the node n_in. Likewise, one source/drain of the transistor MPT4 is coupled to the node p_in, and the other source/drain of the transistor MPT4 is coupled to a source/drain of the transistor MPT5. The other source/drain of the transistor MPT5 is coupled to the node n_in. A gate of the transistor MNT4 is coupled to receive the bias voltage nbias. A gate of the transistor MNT5 is coupled to receive a control voltage en. A gate of the transistor MPT5 is coupled to receive the bias voltage pbias. A gate of the transistor MPT4 is coupled to receive a control voltage en_b_vcco. The control voltages en and en_b_vcco are generated by the control circuit 128. The control voltages en and en_b_vcco are logical inverses of each other, but with different voltage swings. In particular, the control voltage en is 0 V in HV mode and vcco in LV mode. The control voltage en_b_vcco is vcco in HV mode and 0 in LV mode.

The transmission gate 206 includes n-channel transistors MNT6 and MNT7. Substrate terminals of the transistors MNT6 and MNT7 are coupled to the ground node gnd. A source/drain of the transistor MNT6 is coupled to the node pgate_top, and the other source/drain of the transistor MNT6 is coupled to a source/drain of the transistor MN7. The other source/drain of the transistor MNT7 is coupled to a node formed by the source of the transistor MNT2 and the drain of the transistor MNT3. A gate of the transistor MNT6 is coupled to receive the bias voltage nbias. A gate of the transistor MNT7 is coupled to receive the control voltage en.

Table 3 shows the bias and control voltage conditions for both the HV and LV modes.

TABLE 3

| Mode | Signal Condition (V) | | | |
| --- | --- | --- | --- | --- |
|  | nbias | en | en_b_vcco | pbias |
| LV | 1.8 | vcco | 0 | 0 |
| HV | 1.8 | 0 | vcco | (vcco − 1.8) |

The transistors MNT4, MNT5, MPT4, and MPT5 function as switches. In the LV mode, the transistors MNT4 and MPT5 are biased on. Further, the control voltages en and en_b_vcco bias the transistors MNT5 and MPT4 on. Thus, the nodes p_in and n_in are common and swing between 0 and vcco. The output node pgate_top also swings from 0 to vcco with the help of transistors MNT6 and MNT7, each of which is biased on. In HV mode, the control voltages en and en_b_vcco bias the transistors MNT5 and MPT4 off. Thus, the nodes p_in and n_in are isolated by the transmission gate 204. Likewise, the transistors MNT7 is biased off and the node pgate_top is isolated from the source of the transistor MNT2 and the drain of the transistor MNT3. The node pgate_top swings from (vcco-1.8) to vcco. This ensures there are no reliability issues in the HV mode of operation. The node p_in swings from (vcco-1.8) to vcco. The node n_in swings from 0 to vccaux.

Figure 3:
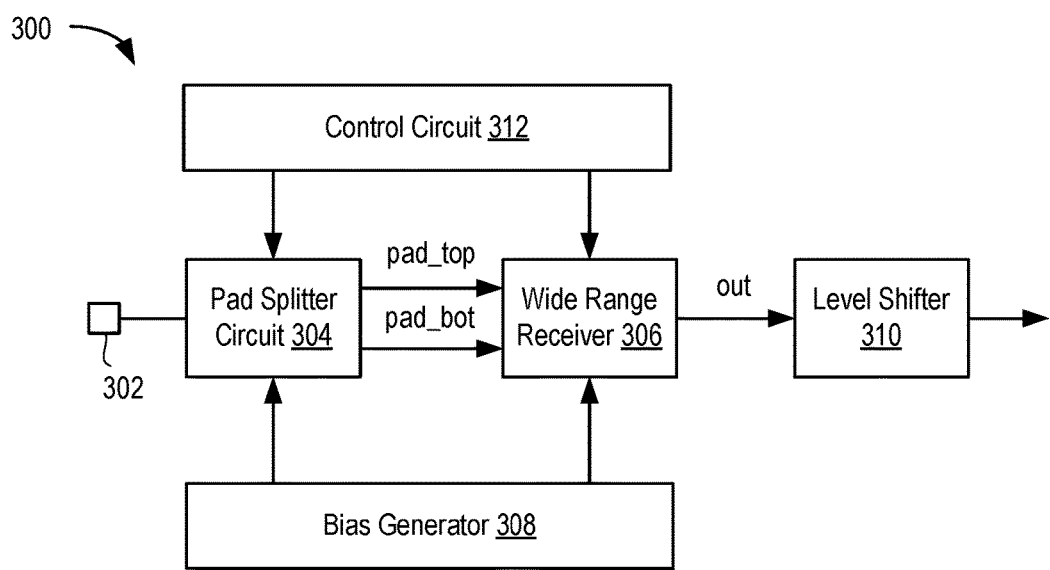
FIG. 3 is a block diagram depicting a receiver according to an example.

FIG. 3 is a block diagram depicting a receiver 300 according to an example. The receiver 300 includes an input pad 302, a pad splitter circuit 304, a wide-range receiver 306, a bias generator 308, a level-shifter 310, and a control circuit 312. An input of the pad splitter circuit 304 is coupled to the pad 302. Outputs of the pad splitter circuit 304 (designated pad_top and pad_bot) are coupled to inputs of the wide-range receiver 306. An output of the wide-range receiver 306 (designated out) is coupled to an input of the level-shifter 310. An output of the level-shifter 310 provides the output of the receiver 300. Outputs of the bias generator 308 are coupled to inputs of the pad splitter circuit 304 and the wide-range receiver 306 to provide various bias voltages. Outputs of the control circuit 312 are coupled to inputs of the pad splitter circuit 304 and the wide-range receiver 306 to provide control voltages thereto.

With advancements in technology and shrinking transistor dimensions, IO transistors (p-channel and n-channel) have lower maximum voltages across any two terminals thereof (e.g., 1.89 V). Therefore, in the HV mode (e.g., vcco=3.3 V or 2.5 V), techniques are needed to restrict the voltage difference between any two terminals of the IO transistors. The bias generator 308 generates different bias voltages depending on the operational mode (HV or LV). Likewise, the control circuit 312 generates different control voltages depending on the operational mode (HV or LV). The pad splitter circuit 304 generates the pad_top and pad_bot voltages from the pad voltage (i.e., the voltage on the pad 302) depending on the mode, as described further below. The wide-range receiver 306 is a Schmitt Trigger that combines two receivers into a single entity that supports the entire vcco range (e.g., 3.3 V to 1.2 V). Examples of the wide-range receiver 306 are described further below.

Figure 5:
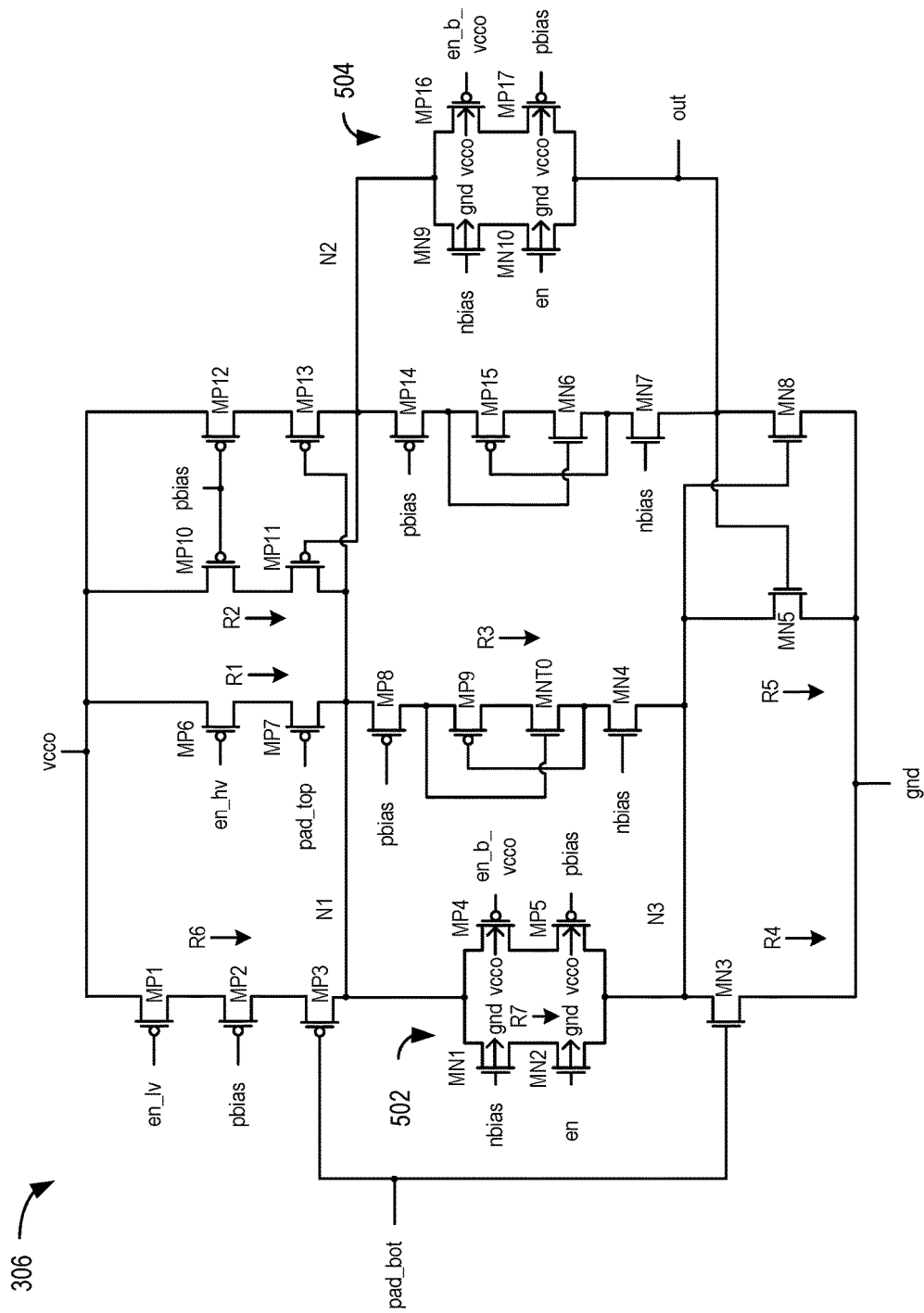
FIG. 5 is a schematic diagram depicting an example of a wide-range receiver.

FIG. 5 is a schematic diagram depicting an example of the wide-range receiver 306. The wide-range receiver 306 includes p-channel transistors MP1 through MP17, an n-channel transistor MNT0, and n-channel transistors MN1 through MN10.

A source of the transistor MP1 is coupled to the supply node vcco. A drain of the transistor MP1 is coupled to a source of the transistor MP2. A drain of the transistor MP2 is coupled to a source of the transistor MP3. A drain of the transistor MP3 is coupled to a node N1. A gate of the transistor MP1 receives a control voltage en_lv (generate by the control circuit 312). A gate of the transistor MP2 receives a bias voltage pbias (generated by the bias generator 308). A gate of the transistor MP3 is coupled to a node pad_bot (output by the pad splitter circuit 304).

A source of the transistor MP6 is coupled to the supply node vcco. A drain of the transistor MP6 is coupled to a source of the transistor MP7. A drain of the transistor MP7 is coupled to the node N1. A gate of the transistor MP6 receives a control voltage en_hv (generated by the control circuit 312). A gate of the transistor MP7 is coupled to a node pad_top (output by the pad splitter circuit 304).

A source of the transistor MP10 is coupled to the supply node vcco. A drain of the transistor MP10 is coupled to a source of the transistor MP11. A drain of the transistor MP11 is coupled to the node N1. A source of the transistor MP12 is coupled to the supply node vcco. A drain of the transistor MP12 is coupled to a source of the transistor MP13. A drain of the transistor MP13 is coupled to a node N2. A gate of the transistor MP10 is coupled to a gate of the transistor MP12, each of which is also coupled to the node supplying the bias voltage pbias. A gate of the transistor MP13 is coupled to the node N1. A gate of the transistor MP11 is coupled to the node N2.

Substrate terminals of the transistors MN1 and MN2 are coupled to the ground node gnd. Substrate terminals of the transistors MP4 and MP5 are coupled to the supply node vcco. One source/drain of the transistor MN1 is coupled to the node N1, and the other source/drain of the transistor MN1 is coupled to a source/drain of the transistor MN2. The other source/drain of the transistor MN2 is coupled to a node N3. Likewise, one source/drain of the transistor MP4 is coupled to the node N1, and the other source/drain of the transistor MP4 is coupled to a source/drain of the transistor MP5. The other source/drain of the transistor MP5 is coupled to the node N3. A gate of the transistor MN1 is coupled to receive a bias voltage nbias. A gate of the transistor MN2 is coupled to receive a control voltage en. A gate of the transistor MP5 is coupled to receive the bias voltage pbias. A gate of the transistor MP4 is coupled to receive a control voltage en_b_vcco. The transistors MN1, MN2, MP4, and MP5 form a transmission gate 502.

A source of the transistor MP8 is coupled to the node N1. A drain of the transistor MP8 is coupled to a source of the transistor MP9. A drain of the transistor MP9 is coupled to a drain of the transistor MNT0. A source of the transistor MNT0 is coupled to a drain of the transistor MN4. A source of the transistor MN4 is coupled to the node N3. A gate of the transistor MP8 is coupled to the bias node pbias. A gate of the transistor MN4 is coupled to the bias node nbias. A gate of the transistor MNT0 is coupled to the drain of the transistor MP8. A gate of the transistor MP9 is coupled to the drain of the transistor MN4.

A source of the transistor MP14 is coupled to the node N2. A drain of the transistor MP14 is coupled to a source of the transistor MP15. A drain of the transistor MP15 is coupled to a drain of the transistor MN6. A source of the transistor MN6 is coupled to a drain of the transistor MN7. A source of the transistor MN7 is coupled to the out node. A gate of the transistor MP14 is coupled to the bias node pbias. A gate of the transistor MN7 is coupled to the bias node nbias. A gate of the transistor MN6 is coupled to the drain of the transistor MP14. A gate of the transistor MP15 is coupled to the drain of the transistor MN7.

Substrate terminals of the transistors MN9 and MN10 are coupled to the ground node gnd. Substrate terminals of the transistors MP16 and MP17 are coupled to the supply node vcco. One source/drain of the transistor MN9 is coupled to the node N2, and the other source/drain of the transistor MN9 is coupled to a source/drain of the transistor MN10. The other source/drain of the transistor MN10 is coupled to the out node. Likewise, one source/drain of the transistor MP16 is coupled to the node N2, and the other source/drain of the transistor MP16 is coupled to a source/drain of the transistor MP17. The other source/drain of the transistor MP17 is coupled to the out node. A gate of the transistor MN9 is coupled to receive the bias voltage nbias. A gate of the transistor MN10 is coupled to receive a control voltage en. A gate of the transistor MP17 is coupled to receive the bias voltage pbias. A gate of the transistor MP16 is coupled to receive a control voltage en_b_vcco. The transistors MN9, MN10, MP16, and MN17 form a transmission gate 504.

A drain of the transistor MN3 is coupled to the node N3. A source of the transistor MN3 is coupled to the node gnd. A gate of the transistor MN3 is coupled to the node pad_bot. A drain of the transistor MN5 is coupled to the node N3. A source of the transistor MN5 is coupled to the node gnd. A drain of the transistor MN8 is coupled to the out node. A source of the transistor MN8 is coupled to the node gnd. A gate of the transistor MN8 is coupled to the node N3. A gate of the transistor MN5 is coupled to the out node.

Figure 4:
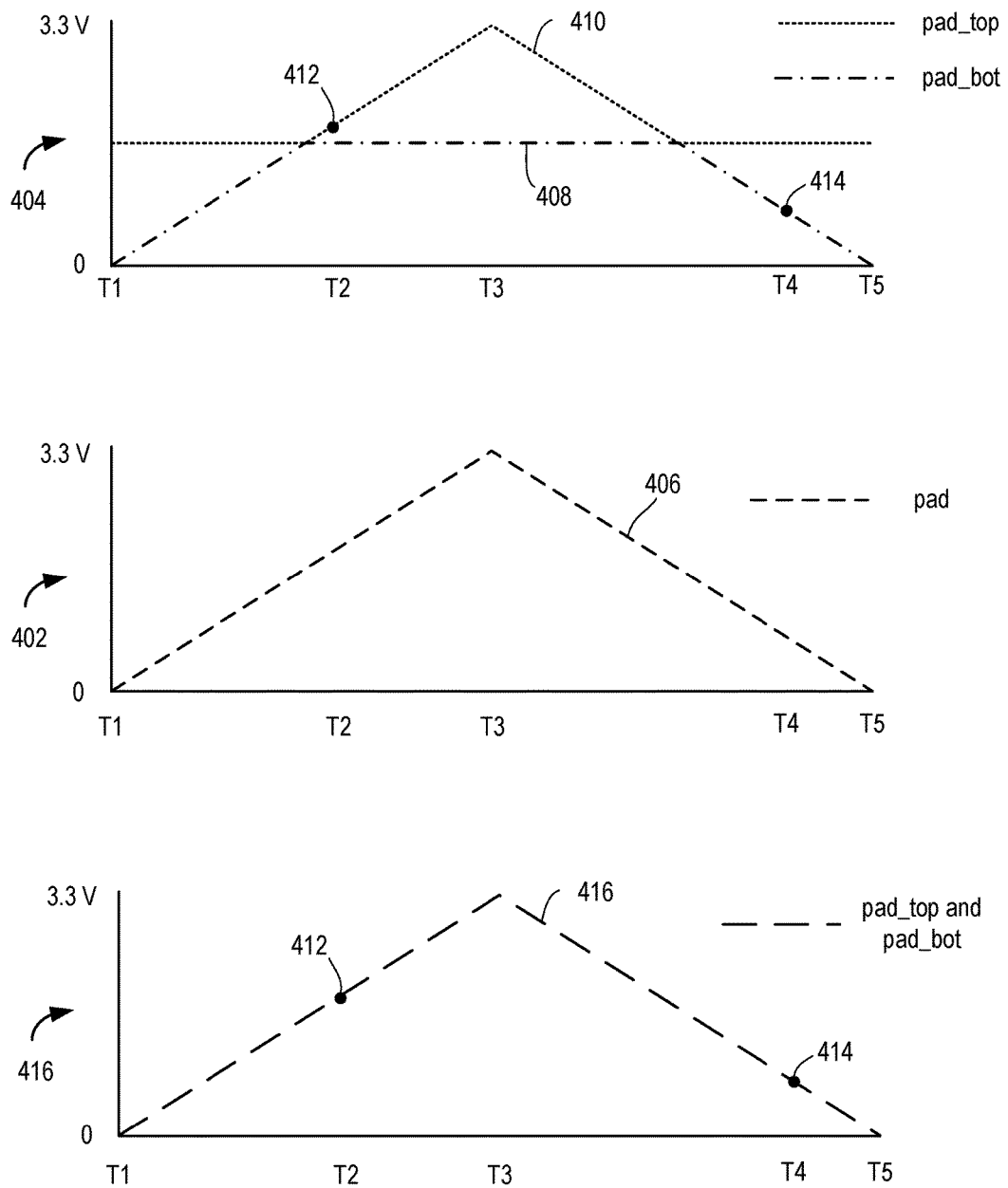
FIG. 4 illustrates graphs that describe operation of the receiver of FIG. 3.

Operation of the wide-range receiver 306 can be understood with reference to the graphs in FIG. 4. The graphs in FIG. 4 include x-axes that represent time, in particular, time instants T1 through T5, and y-axes that represent voltage. A graph 402 shows the pad voltage (i.e., the voltage at the input pad 302). A graph 404 shows the voltages pad_top and pad_bot in the HV mode. A graph 406 shows the voltages pad_top and pad_bot in the LV mode. The bias and enable voltages for the HV and LV mode are summarized in Table 4.

TABLE 4

| Voltage Condition | en | en_b_vcco | pbias | nbias | en_hv | en_lv |
|---|---|---|---|---|---|---|
| HV | 0 | vcco | vcco-1.8 | 1.8 | pbias | vcco |
| LV | vcco | 0 | 0 | vcco | vcco | 0 |

Table 5 summarizes the voltage range of pad_top and pad_bot generated by the pad splitter circuit 304 for the HV and LV modes (where vtn and vtp are the threshold voltages of n-channel and p-channel transistors, respectively).

TABLE 5

| Voltage Condition | Pad | Pad_bot | Pad_top |
|---|---|---|---|
| HV | 0 to vcco | 0 to nbias − vtn | Pbias + vtp to vcco |
| LV | 0 to vcco | 0 to vcco | 0 to vcco |

In HV mode, the pad splitter circuit 304 generates pad_top and pad_bot voltages as described in Table 5 and shown in graph 404. The voltage pad_bot does ramps up and clips at (nbias-vtn). The voltage pad_top starts at (pbias+vtp) and ramps up to 3.3. The voltage pad_bot then ramps down to 0. The voltage pad_top then ramps down to (pbias+vtp). This ensures that transistors MP3, MP7, and MN3 operate within reliable limits (i.e., the voltage between any two terminals does not exceed a maximum voltage, e.g., 1.8 V). In LV mode, the pad splitter circuit 304 generates pad_top and pad_bot to be the same voltage. For example, the pad splitter circuit 304 can short pad_top and pad_bot using a transmission gate. As shown in the graph 416, both pad_top and pad_bot have the full swing from 0 to vcco and from vcco to 0. As shown in the graph 402, in both the HV and LV modes, the pad voltage swings from 0 to vcco and from vcco to 0.

Assume HV mode. At time T1, transistor MP3 is off, as en_lv is equal to vcco. Both of the transmission gates 502 and 504 are off due to the state of the control voltages en and en_b_vcco. The voltage pad_bot is 0 and the voltage pad_top is (pbias+vtp). The transistors MP6 . . . MP9, MNT0, and MN4 are on. This sets the node N1 to vcco and the node N3 to (nbias−vtn). The transistor MP13 is off. The transistors MP14, MP15, and MN6 . . . MN8 are on. As such, the out node is at 0V and node N2 is at (pbias+vtp). This sets the transistors MP11 and MP10 to on. All transistors are in the linear region. Assume the effective resistance of the transistors MP6 and MP7 is R1; the effective resistance of transistors MP10 and MP11 is R2; the effective resistance of transistors MP8, MP9, MNT0, and MN4 is R3; and the effective resistance of transistor MN3 is R4. The resistance R4 is high-impedance at T1 since the transistor MN3 is off.

Assume HV mode and time T1 to T3. As pad_bot increases, R4 reduces. As pad_top increases, R1 increases. There is contention between R4 and the parallel combination of R1 and R2 (R1//R2). At some point, R4 becomes sufficiently small compared to (R1//R2)+R3 that it pulls the node N3 to ground and the node N1 to pbias+vt. This turns off the transistor MN8 and turns on the transistor MP13. The node N2 becomes vcco, effectively shutting off R2. This trigger point (point 412 in FIG. 4), occurring at time T2, is referred to as input high threshold (VIH).

Assume HV mode and time T3. Pad_top reaches vcco, which turns off the transistor MP7. As such, R1 becomes high-impedance. Node N3 becomes gnd and node N1 goes to pbias+vtp. The node N2 goes to vcco, thus shutting off R2. The output node goes to nbias-vtn, which is the output of the Schmitt trigger. R2 is shut off and the transistor MN5 turns on, providing effective resistance R5. The circuit is ready for high-to-low transition.

Assume HV mode and time T3 to T5. Pad_top moves from vcco towards pbias and pad_bot falls from nbias to 0. During the transition, R4 increases and R1 reduces. R1 is in contention with (R4//R5)+R3. At some point (e.g., T4), R1<<(R4//R5+R3), and the circuit triggers node N1 to be vcco. This switching point at T4 (414 in FIG. 4) is referred to as input low threshold (VIL). The node N1 goes to vcco and the node N3 goes to nbias-vtn. This trigger sets latching into action, forcing the node N2 to pbias+vtp and the output node to 0 due to regenerative feedback.

VIH can be independently fine-tuned by sizing MP10 and MP11. VIL can be independently fine-tuned by sizing MN5. Thus, hysteresis for the circuit can be fine-tuned (hysteresis=VIH−VIL). For coarse correction, decreasing R1 or increasing R4 will increase VIL and VIH together. The opposite will reduce VIL and VIH together. R3 will control the amount of current drawn when the input slew is very slow. Duty cycle distortion (DCD) can be controlled by sizing MP12, MP13, and MN8 appropriately.

It can be further observed that, during the entire cycle from T1 to T5, the voltage of all nodes are such that any two terminals of a transistor does not exceed a maximum voltage (e.g., 1.89 V). MP9 and MNT0 helps to slow charging and discharging of the node between them and helps reduce stress (e.g., HCI) during high-frequency operation.

In LV mode, the wide-range receiver 306 operates similar to the HV mode described above with the following exceptions. The pad splitter circuit 304 shorts pad_top and pad_bot to make them equivalent to the input pad 302. Other conditions of the bias and control voltages are shown above in Table 4. Both the transmission gates 502 and 504 are on so that the node N1 is coupled to the node N3 and the node N2 is coupled to the out node. The effective resistance of the transmission gate 502 is R7. The resistance R7 is in parallel with the resistance R3. However, the resistance R7<<R3, so the resistance R7 effectively replaces the resistance R3 present in the HV mode. At time T1, pad_bot is 0. The effective resistance of MP1, MP2, and MP3 is R6. The parallel combination of R6 and R2 is in contention with R4 when the input rises, which determines the trigger VIH. The parallel combination of R4 and R5 is in contention with R6 when the input falls, which determines the trigger VIL.

Figure 6:
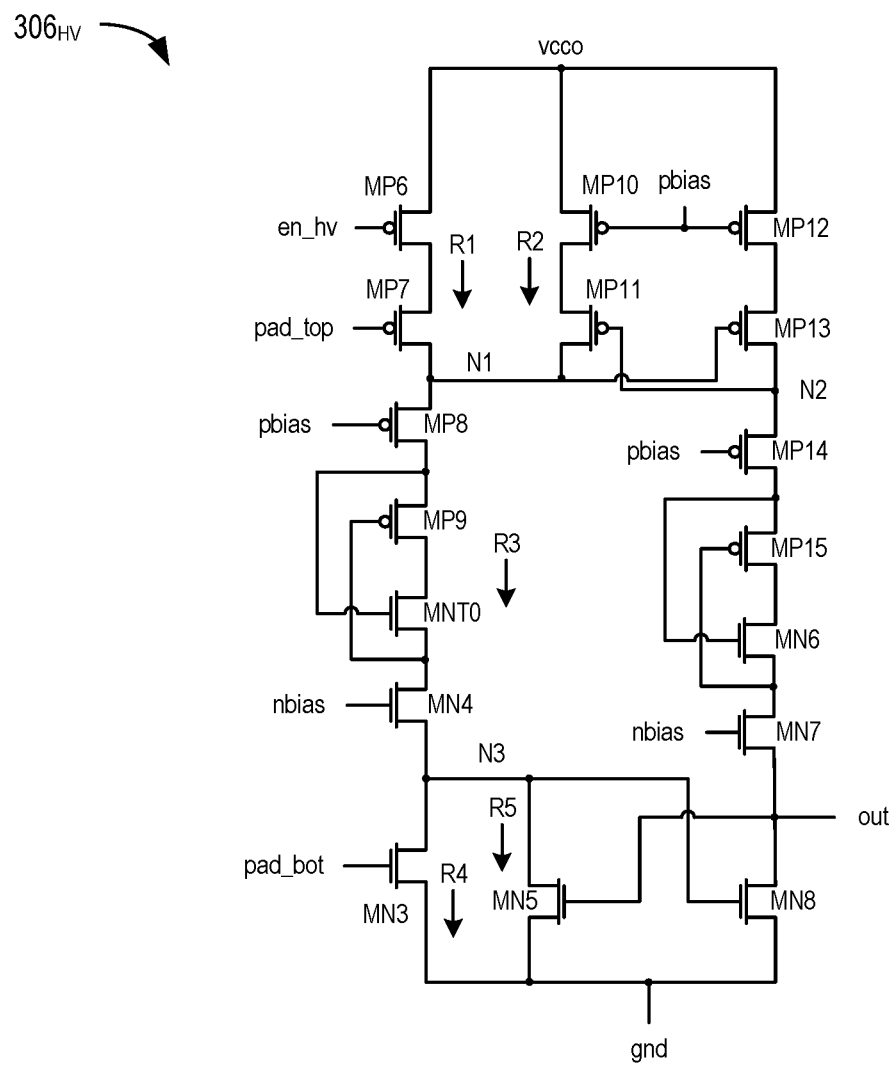
FIG. 6 shows the wide-range receiver of FIG. 5 in a high-voltage mode.
Figure 7:
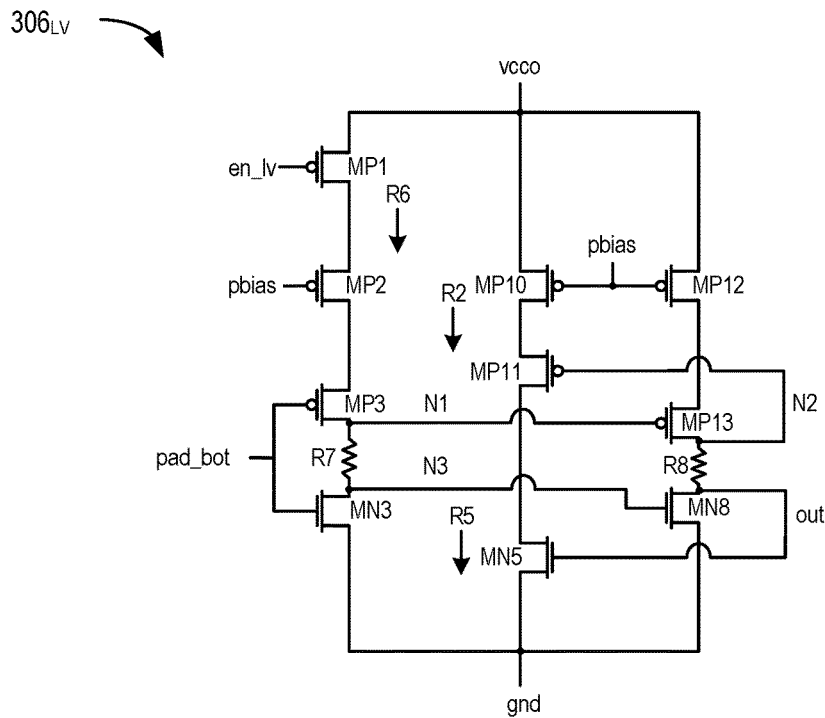
FIG. 7 shows the wide-range receiver of FIG. 5 in a low-voltage mode.

The wide-range receiver 306 combines two receivers, where one receiver is enabled in HV mode and the other receiver is enabled in LV mode. FIG. 6 shows a receiver 306Hv formed in the HV mode. The receiver 306Hv results from opening the transmission gates 502 and 504, enabling HV mode, and disabling LV mode. FIG. 7 shows a receiver 306Lv formed in the LV mode. The receiver 306Lv results from closing the transmission gates 502 and 504, disabling HV mode, and enabling LV mode. Closing the transmission gate 502 couples nodes N1 and N3 through the effective resistance R7 of the transmission gate 502. Likewise, closing the transmission gate 504 couples the nodes N2 and out through an effective resistance R8 of the transmission gate 504. Note the structures of the receiver $306_{Hv}$ and $306_{Lv}$ shown in FIGS. 6 and 7 are examples. The framework for combining two receivers can be used to combine receivers having other structures than shown in FIGS. 6 and 7.

Under certain conditions, switching between two receivers may not be desirable (to remove glitches). In such cases, the control voltage en_lv can be used to enable/disable the wide-range receiver 306 and the control voltage en_hv can be optionally turned ON or OFF to meet specification in the HV mode. This also ensures glitch-less operation of the wide-range receiver 306. Once enabled, the control voltage en_lv is always ON (pbias) regardless of vcco. The control voltage en_hv turns ON or OFF based on vcco (e.g., if vcco is 2.5 V or 3.3 V, en_hv is pbias; if vcco is 1.8 V or less, en_hv is vcco). Thus ensures that whenever there is a transition from LV to HV mode or vice-versa, one leg controlled by en_lv is always on and switching of en_hv based on vcco will add parallel resistance (since Schmitt receivers never go into three-state, there is no glitch).

Figure 8A:
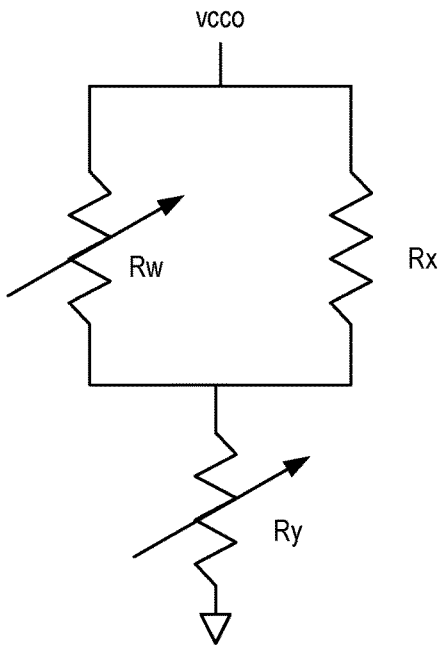
FIGS. 8A and 8B illustrate operation of the wide-range receiver of FIG. 5.
Figure 8B:
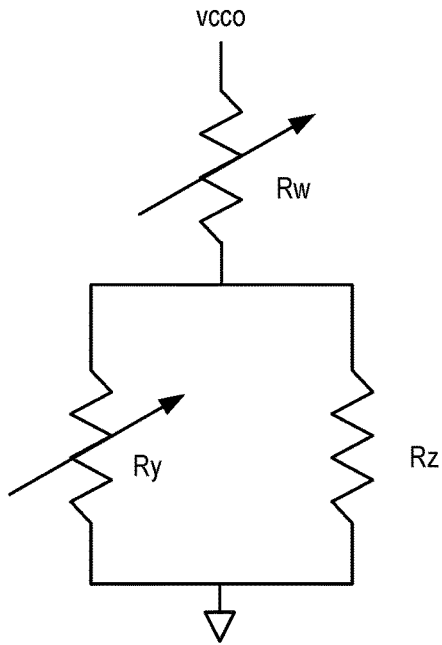

FIGS. 8A and 8B illustrate operation of the wide-range receiver 306. FIG. 8A illustrates operation as the wide-range receiver 306 approaches the VIH trigger. FIG. 8B illustrates operation as the wide-range receiver 306 approaches the VIL trigger. As shown in FIG. 8A, during the rise transition, Rw (which is increasing with respect to the rise transition) is in parallel with Rx (a constant resistance). The parallel combination is in contention with Ry, which is reducing with respect to the rise transition. The point at which switching occurs due to contention gives rise to VIH. As shown in FIG. 8B, during a fall transition, Rw (which is reducing with respect to the fall transition) is in contention with the parallel combination of Ry (which is increasing with respect to the fall transition) in parallel with Rz (a constant resistance) to achieve VIL.

Figure 9:
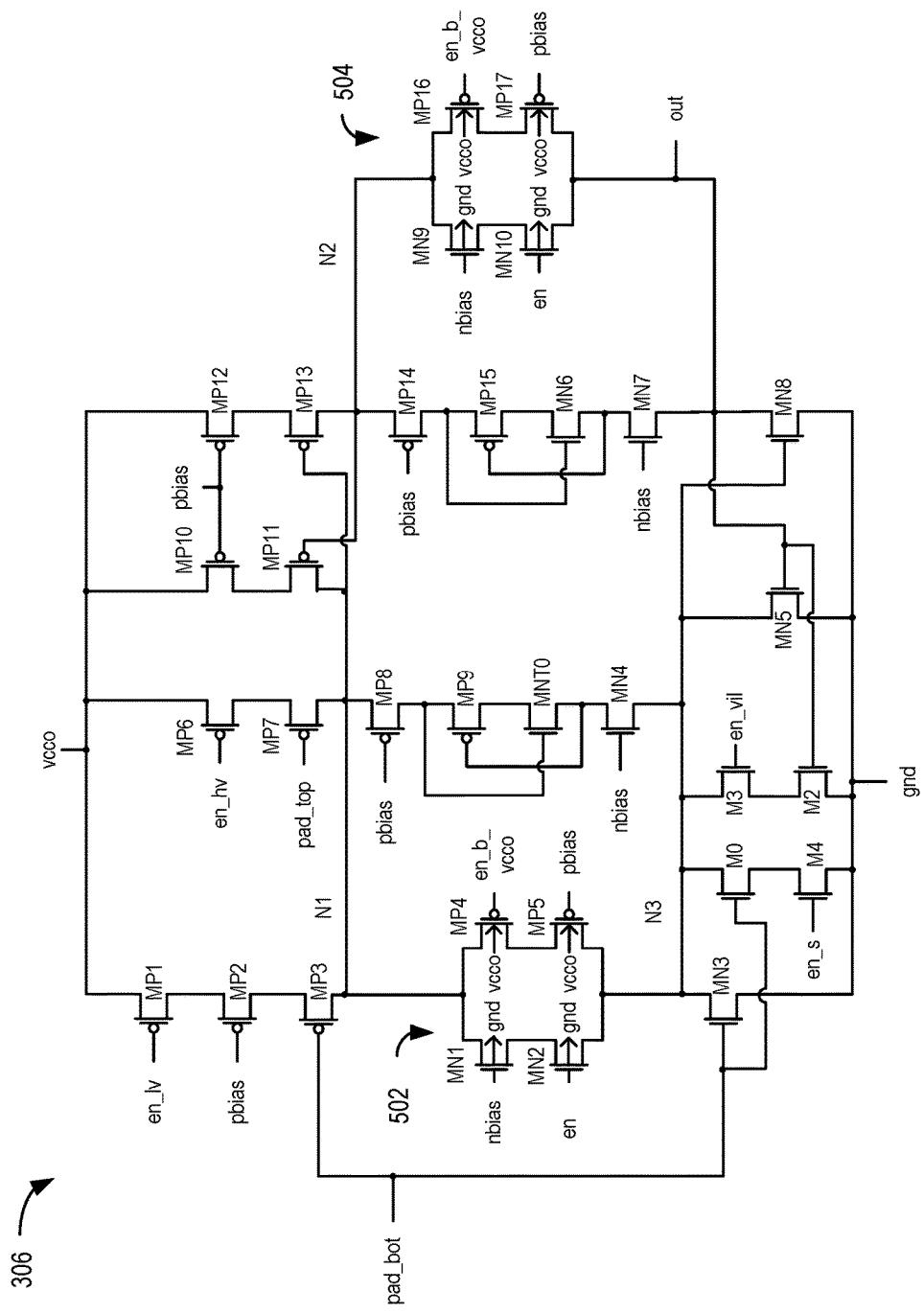
FIG. 9 is a schematic diagram depicting another example of the wide-range receiver.

FIG. 9 is a schematic diagram depicting another example of the wide-range receiver 306. Elements in FIG. 9 that are the same or similar to those of FIG. 5 are designated with identical reference numerals and described in detail above. In the present example, transistors M0, M2, M3, and M4 are added to the wide-range receiver 306. A drain of the transistor M0 is coupled to the N3. A source of the transistor M0 is coupled to a drain of the transistor M4. A source of the transistor M4 is coupled to the gnd node. A drain of the transistor M3 is coupled to the node N3. A source of the transistor M3 is coupled to a drain of the transistor M2. A source of the transistor M2 is coupled to the gnd node. A gate of the transistor M0 is coupled to pad_bot. A gate of the transistor M2 is coupled to the node N3. The gate of the transistor M4 receives a control voltage en_s (generated by the control circuit 312). The gate of the transistor M3 receives a control voltage en_vil (generated by the control circuit 312). The transistors M0 and M4 can be used to program (increase/decrease) VIH and VIL together. The transistors M2 and M3 can be used to program (increase/decrease) VIL individually. In another example (not explicitly shown), similar p-channel transistors can be added between the nodes N2 and vcco to control VIH independently.

The wide-range receiver 306 shown in FIG. 5 provides the framework for combining a low-voltage Schmitt receiver with a high-voltage Schmitt receiver, example structures of which are shown in FIGS. 6-7. The wide-range receive 306 reduces area and power consumption with respect to separate implementations of high-voltage and low-voltage Schmitt receivers. The wide-range receiver 306 further provides for glitch-free operation, as described above.

Figure 10:
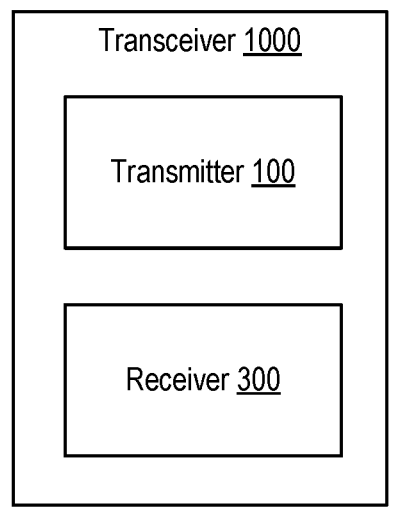
FIG. 10 is a block diagram depicting a transceiver according to an example.

FIG. 10 is a block diagram depicting a transceiver 1000 according to an example. The transceiver 1000 includes the transmitter 100 and the receiver 300. The transmitter 100 is constructed and operates as described above with respect to FIGS. 1-2. The receiver 300 is constructed and operates as described above with respect to FIGS. 3-9.

Figure 11:
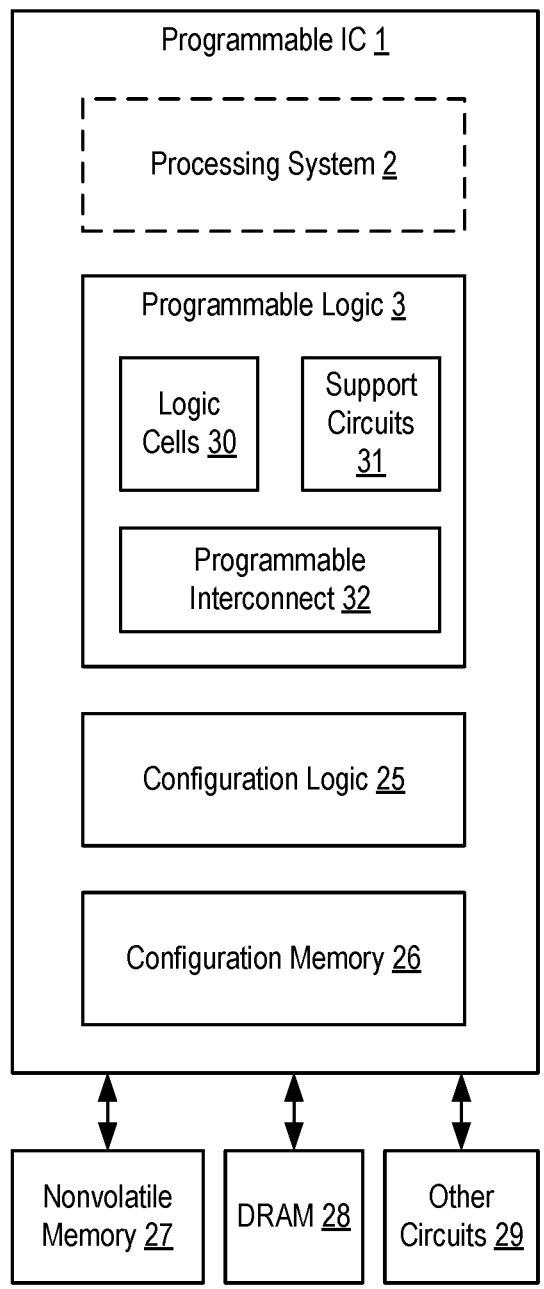
FIG. 11 is a block diagram depicting a programmable IC according to an example.

FIG. 11 is a block diagram depicting a programmable IC 1 according to an example. The programmable IC 1 includes programmable logic 3, configuration logic 25, and configuration memory 26. The programmable IC 1 can be coupled to external circuits, such as nonvolatile memory 27, DRAM 28, and other circuits 29. The programmable logic 3 includes logic cells 30, support circuits 31, and programmable interconnect 32. The logic cells 30 include circuits that can be configured to implement general logic functions of a plurality of inputs. The support circuits 31 include dedicated circuits, such as transceivers, input/output blocks, digital signal processors, memories, and the like. The support circuits 31 can include one or more instances of the transmitter 100, the receiver 300, and/or the transceiver 1000. The logic cells and the support circuits 31 can be interconnected using the programmable interconnect 32. Information for programming the logic cells 30, for setting parameters of the support circuits 31, and for programming the programmable interconnect 32 is stored in the configuration memory 26 by the configuration logic 25. The configuration logic 25 can obtain the configuration data from the nonvolatile memory 27 or any other source (e.g., the DRAM 28 or from the other circuits 29). In some examples, the programmable IC 1 includes a processing system 2. The processing system 2 can include microprocessor(s), memory, support circuits, IO circuits, and the like. The processing system 2 can include one or more instances of the transmitter 100, the receiver 300, and/or the transceiver 1000.

Figure 12:
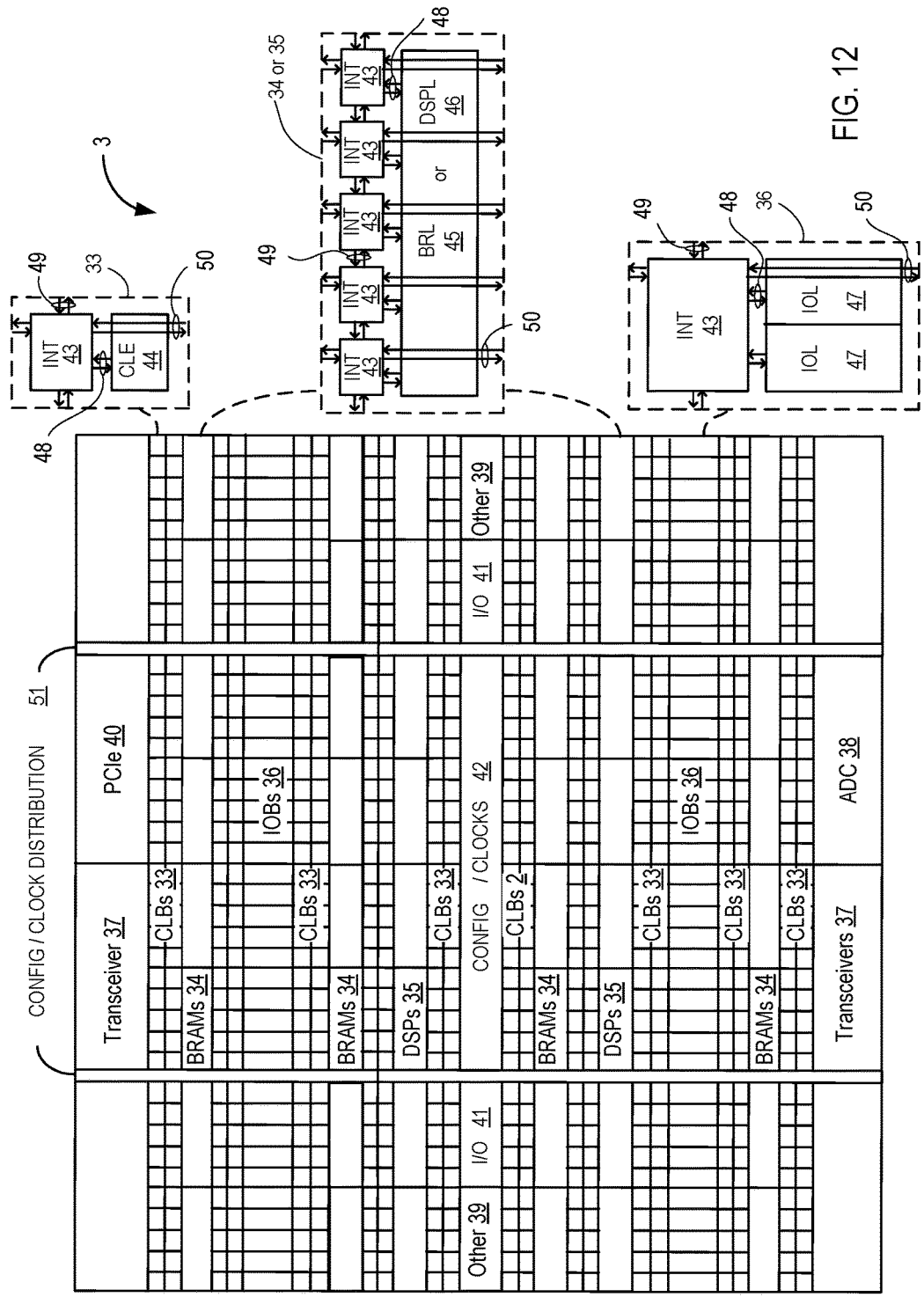
FIG. 12 illustrates a field programmable gate array (FPGA) implementation of the programmable IC of FIG. 10.

FIG. 12 illustrates a field programmable gate array (FPGA) implementation of the programmable IC 1 that includes a large number of different programmable tiles including transceivers 37, configurable logic blocks ("CLBs") 33, random access memory blocks ("BRAMs") 34, input/output blocks ("IOBs") 36, configuration and clocking logic ("CONFIG/CLOCKS") 42, digital signal processing blocks ("DSPs") 35, specialized input/output blocks ("I/O") 41 (e.g., configuration ports and clock ports), and other programmable logic 39 such as digital clock managers, analog-to-digital converters, system monitoring logic, and so forth. The FPGA can also include PCIe interfaces 40, analog-to-digital converters (ADC) 38, and the like. The transceivers 37 can include one or more instances of the transceiver 1000. In other examples, the FPGA can include one or more instances of the transmitter 100 and/or the receiver 300 separate from one another (i.e., not in a transceiver).

In some FPGAs, each programmable tile can include at least one programmable interconnect element ("INT") 43 having connections to input and output terminals 48 of a programmable logic element within the same tile, as shown by examples included at the top of FIG. 12. Each programmable interconnect element 43 can also include connections to interconnect segments 49 of adjacent programmable interconnect element(s) in the same tile or other tile(s). Each programmable interconnect element 43 can also include connections to interconnect segments 50 of general routing resources between logic blocks (not shown). The general routing resources can include routing channels between logic blocks (not shown) comprising tracks of interconnect segments (e.g., interconnect segments 50) and switch blocks (not shown) for connecting interconnect segments. The interconnect segments of the general routing resources (e.g., interconnect segments 50) can span one or more logic blocks. The programmable interconnect elements 43 taken together with the general routing resources implement a programmable interconnect structure ("programmable interconnect") for the illustrated FPGA.

In an example implementation, a CLB 33 can include a configurable logic element ("CLE") 44 that can be programmed to implement user logic plus a single programmable interconnect element ("INT") 43. A BRAM 34 can include a BRAM logic element ("BRL") 45 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 35 can include a DSP logic element ("DSPL") 46 in addition to an appropriate number of programmable interconnect elements. An IOB 36 can include, for example, two instances of an input/output logic element ("IOL") 47 in addition to one instance of the programmable interconnect element 43. As will be clear to those of skill in the art, the actual I/O pads connected, for example, to the I/O logic element 47 typically are not confined to the area of the input/output logic element 47.

In the pictured example, a horizontal area near the center of the die (shown in FIG. 12) is used for configuration, clock, and other control logic. Vertical columns 51 extending from this horizontal area or column are used to distribute the clocks and configuration signals across the breadth of the FPGA.

Some FPGAs utilizing the architecture illustrated in FIG. 12 include additional logic blocks that disrupt the regular columnar structure making up a large part of the FPGA. The additional logic blocks can be programmable blocks and/or dedicated logic.

Note that FIG. 12 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 12 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. A transmitter, comprising:
    an input circuit configured to couple a logic signal to a first node and a second node;
    a first level-shifter having an input coupled to the first node;
    a first pre-driver having an input coupled to an output of the first level-shifter;
    a second-level shifter having an input coupled to the second node, the second level-shifter is configured to perform a first level shift of the logic signal to generate a first logic signal and a second level shift of the logic signal to generate a second logic signal, and wherein an output of the second level-shifter includes the first logic signal and the second logic signal;
    a second pre-driver having an input coupled to the output of the second level-shifter, the second pre-driver configured to generate an output signal having a first voltage swing in a first mode and a second voltage swing in a second mode, the second pre-driver comprising a stack of a first p-channel transistor, a second p-channel transistor, a first n-channel transistor, and a second n-channel transistor coupled between a supply node and a reference node, a gate of the first p-channel transistor receiving the first logic signal, a gate of the second n-channel transistor receiving the second logic signal, and gates of the second p-channel transistor and the first n-channel transistor receiving a first and second bias voltages, respectively; and
    a driver including a stack of a top p-channel transistor, a bottom p-channel transistor, a top n-channel transistor, and a bottom n-channel transistor coupled between a the supply node and a ground node, a gate of the top p-channel transistor coupled to receive the output signal of the second pre-driver, a gate of the bottom n-channel transistor coupled to an output of the first pre-driver, and gates of the bottom p-channel transistor and the top n-channel transistor coupled to receive the first and second bias voltages, respectively.

2. The transmitter of claim 1, wherein the second pre-driver comprises:
    a third p-channel transistor and a third n-channel transistor coupled between the second p-channel transistor and the first n-channel transistor, a gate of the third p-channel transistor coupled to a source of the third n-channel transistor and a drain of the first n-channel transistor, a gate of the third n-channel transistor coupled to a source of the third p-channel transistor and a drain of the second p-channel transistor.

3. The transmitter of claim 1, wherein the second pre-driver comprises:
    a slew control circuit coupled between the second n-channel transistor and the reference node.

4. The transmitter of claim 1, wherein the second pre-driver comprises:
    a transmission gate coupled between the gate of the first p-channel transistor and a gate of the second n-channel transistor, the transmission gate including a first control terminal coupled to receive a first enable signal and a second control terminal coupled to receive a second enable signal.

5. The transmitter of claim 4, wherein the second pre-driver comprises:
    fourth and fifth n-channel transistors coupled between a drain of the first p-channel transistor and a drain of the second n-channel transistor, a gate of the fourth n-channel transistor coupled to receive the second bias voltage and a gate of the fifth n-channel transistor coupled to receive the first enable signal.

6. A receiver, comprising:
    a pad splitter circuit coupled to a pad, the pad splitter circuit configured to generate a first logic signal and a second logic signal;
    a wide-range receiver coupled to the pad splitter circuit to receive the first and second logic signals, the wide-range receiver comprising a combination of a first Schmitt trigger receiver and a second Schmitt trigger receiver and further comprising:
        first, second, and third p-channel transistors coupled between a supply node and a top input node, a gate of the first p-channel transistor coupled to receive a first enable voltage, a gate of the second p-channel transistor coupled to receive a first bias voltage, and a gate of the third p-channel transistor coupled to receive the second logic signal;

a first n-channel transistor coupled between a bottom input node and a reference node, a gate of the first n-channel transistor coupled to receive the second logic signal; and a first transmission gate coupled between the top input node and the bottom input node;

a control circuit coupled to the pad splitter circuit and the wide-range receiver; and a bias generator circuit coupled to the pad splitter circuit and the wide-range receiver.

7. The receiver of claim 6, wherein the wide-range receiver comprises:

fourth and fifth p-channel transistors coupled between the supply node and the top input node, a gate of the fourth p-channel transistor coupled to receive a second enable voltage, and a gate of the fifth p-channel transistor coupled to receive the first logic signal; and sixth and seventh p-channel transistors, and second and third n-channel transistors(MNT0, MN4), coupled between the top input node and the bottom input node, a gate of the sixth p-channel transistor coupled to receive the first bias voltage, a gate of the third n-channel transistor coupled to receive a second bias voltage.

8. The receiver of claim 7, wherein the wide-range receiver comprises:

eighth and ninth p-channel transistors coupled between the supply node and the top input node; and tenth and eleventh p-channel transistors coupled between the supply node and a top output node;

where a gate of the eighth p-channel transistor is coupled to a gate of the tenth p-channel transistor, a gate of the ninth p-channel transistor is coupled to the top output node, and a gate of the eleventh p-channel transistor is coupled to the top input node.

9. The receiver of claim 8, wherein the wide-range receiver comprises:

twelfth and thirteenth p-channel transistors, and fourth and fifth n-channel transistors coupled between the top output node and a bottom output node, a gate of the twelfth p-channel transistor coupled to receive the first bias voltage, a gate of the fifth n-channel transistor coupled to receive the second bias voltage.

10. The receiver of claim 9, wherein the wide-range receiver comprises:

a sixth n-channel transistor coupled between the bottom input node and the reference node;

a seventh n-channel transistor coupled between the bottom output node and the reference node;

wherein a gate of the sixth n-channel transistor is coupled to the bottom output node and a gate of the seventh n-channel transistor(MN8) is coupled to the bottom input node.

11. The receiver of claim 10, wherein the wide-range receiver comprises:

a second transmission gate coupled between the top output node and the bottom output node.

12. The receiver of claim 6, wherein the wide-range receiver includes first circuitry that provides a first resistance and second circuitry that provides a second resistance, the first resistance in parallel to the second resistance, and third circuitry that provides a third resistance, coupled in series with the parallel combination of the first resistance, and wherein the combination of the first, second, and third resistance controls a trigger point of the wide-range receiver.

13. A transceiver, comprising:

a transmitter that includes:

an input circuit configured to couple a logic signal to a first node and a second node;

a first level-shifter having an input coupled to the first node;

a first pre-driver having an input coupled to an output of the first level-shifter;

a second-level shifter having an input coupled to the second node;

a second pre-driver having an input coupled to an output of the second level-shifter, the second pre-driver configured to generate an output signal having a first voltage swing in a first mode and a second voltage swing in a second mode; and a driver including a stack of a top p-channel transistor, a bottom p-channel transistor, a top n-channel transistor, and a bottom n-channel transistor coupled between a supply node and a ground node, a gate of the top p-channel transistor coupled to receive the output signal of the second pre-driver, a gate of the bottom n-channel transistor coupled to an output of the first pre-driver, and gates of the bottom p-channel transistor and the top n-channel transistor coupled to receive first and second bias voltages, respectively; and a receiver that includes:

a pad splitter circuit coupled to a pad, the pad splitter circuit configured to generate a first logic signal and a second logic signal;

a wide-range receiver coupled to the pad splitter circuit to receive the first and second logic signals, the wide-range receiver comprising a combination of a first Schmitt trigger receiver and a second Schmitt trigger receiver and further comprising first circuitry that provides a first resistance and second circuitry that provides a second resistance, the first resistance in parallel to the second resistance, and third circuitry that provides a third resistance, coupled in series with the parallel combination of the first resistance, and wherein the combination of the first, second, and third resistance controls a trigger point of the wide-range receiver;

a control circuit coupled to the pad splitter circuit and the wide-range receiver; and a bias generator circuit coupled to the pad splitter circuit and the wide-range receiver.

14. The transceiver of claim 13, wherein the second level-shifter is configured to perform a first level shift of the logic signal to generate a first logic signal and a second level shift of the logic signal to generate a second logic signal, and wherein the output of the second level-shifter includes the first logic signal and the second logic signal.

15. The transceiver of claim 14, wherein the second pre-driver comprises:

a stack of a first p-channel transistor, a second p-channel transistor, a first n-channel transistor, and a second n-channel transistor coupled between the supply node and a reference node, a gate of the first p-channel transistor receiving the first logic signal, a gate of the second n-channel transistor receiving the second logic signal, and gates of the second p-channel transistor and the first n-channel transistor receiving the first and second bias voltages, respectively.

16. The transceiver of claim 15, wherein the second pre-driver comprises:

a third p-channel transistor and a third n-channel transistor coupled between the second p-channel transistor and the first n-channel transistor, a gate of the third p-channel transistor coupled to a source of the third n-channel transistor and a drain of the first n-channel transistor, a gate of the third n-channel transistor coupled to a source of the third p-channel transistor and a drain of the second p-channel transistor.

* * * * *